US007002134B2

(12) United States Patent
Chu et al.

(10) Patent No.: US 7,002,134 B2
(45) Date of Patent: Feb. 21, 2006

(54) DRYER LID/ROBOT COLLISION PREVENTION SYSTEM

(75) Inventors: Yao-Tsung Chu, Taipei (TW); Chih-I Fang, Taipei (TW)

(73) Assignee: Taiwan Semiconductor Manufacturing Co., Ltd., Chu (TW)

( * ) Notice: Subject to any disclaimer, the term of this patent is extended or adjusted under 35 U.S.C. 154(b) by 430 days.

(21) Appl. No.: 10/435,002

(22) Filed: May 9, 2003

(65) Prior Publication Data

US 2004/0222361 A1    Nov. 11, 2004

(51) Int. Cl.
*F26B 5/08* (2006.01)
*F26B 71/24* (2006.01)

(52) U.S. Cl. .................. 250/221; 250/559.4; 34/58

(58) Field of Classification Search ........... 250/221, 250/222.1, 559.4; 34/58, 202; 134/200, 134/902, 95.2; 414/935

See application file for complete search history.

(56) References Cited

U.S. PATENT DOCUMENTS 5,150,532 A * 9/1992 Aigo .......................... 34/58
6,571,488 B1 * 6/2003 Lin et al. ..................... 34/58

FOREIGN PATENT DOCUMENTS

KR    2001092081 A * 10/2001
KR    2001092082 A * 10/2001

* cited by examiner

*Primary Examiner*—Stephone B. Allen
(74) *Attorney, Agent, or Firm*—Tung & Assoc.

(57) ABSTRACT

A dryer lid/robot collision prevention system which prevents inadvertent collision of a spin dryer lid with a transfer robot as the robot approaches and loads wafer-containing cassettes into the spin dryer. The system includes at least one, and typically, a pair of photoelectric sensors mounted on an inner wall behind the spin dryer lid. Each of the photoelectric sensors is electrically connected to a relay circuit which activates a cylinder sensor in the spin dryer in the event that the photoelectric sensors sense the normal position of the open spin dryer lid. The cylinder sensors activate a PLC module, which activates the cassette cradles in the spin dryer. Finally, the activated mode of the cassette cradles signals the transfer robot to approach and load the wafer cassettes into the cassette cradles. The system may include a bypass switch for bypassing the system, as desired.

20 Claims, 2 Drawing Sheets

DRYER LID/ROBOT COLLISION PREVENTION SYSTEM

FIELD OF THE INVENTION

The present invention relates to processes and equipment for cleaning and spin-drying semiconductor wafers in the semiconductor fabrication industry. More particularly, the present invention relates to a system for monitoring the position of a lid on a wet bench spin dryer to prevent inadvertent collision of the lid with a wafer transition robot during placement of wafers in the spin dryer.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 µm, as surface contamination continues to be of high priority to semiconductor manufacturers. To achieve an ultraclean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants. Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer.

Conventionally, wafers cleaned using DI water are subsequently dried using spin dryers. In a spin drying device, a cleaned wafer is rotated at high speeds in order to remove water remaining on the wafer after a rinsing step, using centrifugal force and air flow. The spin drying device is capable of drying wafers at a high throughput. Conventional spin drying devices are broadly classified into three types: multi-cassette dryers, single-cassette dryers and single-wafer dryers.

A typical conventional wet bench spin dryer, such as a KAIJO (trademark) spin dryer for drying residual DI water from semiconductor wafers, is generally indicated by reference numeral 10 in FIG. 1. The spin dryer 10 includes a chamber 11 which contains a pair of cassette cradles 12, each of which receives a wafer cassette 20, containing multiple wafers 21, from a robot arm 19 of a wafer transfer robot 18. A hinge 15 pivotally mounts a lid 13 on the chamber 11. The lid 13 is raised and lowered at the hinge 15 by actuation of a lid cylinder 14. A plastic stabilization chain 16 functions to stabilize the lid 13 in an even plane as the lid 13 is opened.

In operation, the wafer cassettes 20 are initially loaded onto the robot arm 19 of the wafer transfer robot 18, which raises the wafer cassettes 20, as shown by the dashed lines, preparatory to positioning the wafer cassettes 20 for subsequent loading in the cassette cradles 12 of the chamber 11, as shown in the solid lines. Simultaneously, the lid 13 is raised to expose the cassette cradles 12. Normally, the lid 13 remains open, and the robot arm 19 lowers the wafer cassettes 20 unimpeded into the respective cassette cradles 12. The lid 13 is then closed and the cassette cradles 12 are rotated in the chamber 11 to remove residual rinsing water from the wafers 21.

As further shown in FIG. 1, one of the problems commonly encountered in operation of the spin dryer 10 is that the welding joints of the hinge 15 become brittle and weaken after repeated use. Consequently, the typically heavy stainless steel lid 13 falls, as shown by the dashed lines, or the lid 13 shifts away from the normal position, hitting the robot arm 19 and damaging the semiconductor wafers 21 in one or both of the wafer cassettes 20. Another problem that frequently occurs is that the plastic stabilization chain 16 becomes distorted and fails to maintain the lid 13 in an even plane upon opening, thereby causing the robot arm 19 to strike the lid 13 during the cassette-loading operation. It has been found that over a three-year period, about 50 wafers were broken in the heretofore-described manner during the wafer-loading process for one spin dryer. Accordingly, a system is needed for ascertaining the position of a lid on a spin dryer and communicating this information to a wafer transfer robot to prevent the robot from transferring the wafers to the wafer-loading position in the event that the hinge or stabilization chain fails and the lid does not open properly.

An object of the present invention is to provide a system for preventing collision of a spin dryer lid with a wafer transfer robot as the robot loads wafers into a spin dryer.

Another object of the present invention is to provide a system for automatically halting transfer of wafer cassettes to a spin dryer in the event that the lid of the spin dryer fails to open properly.

Still another object of the present invention is to provide a dryer lid/robot collision prevention system which prevents wafer damage and scrapping.

Yet another object of the present invention is to provide a dryer lid/robot collision prevention system which ascertains the proper position of a spin dryer lid prior to activating robot-controlled loading of wafers into the spin dryer in order to prevent inadvertent collision of the lid with the robot.

A still further object of the present invention is to provide a dryer lid/robot collision prevention system which utilizes at least one photoelectric sensor to ascertain the position of a spin dryer lid prior to actuating a wafer transfer robot in the transfer of wafer cassettes containing wafers into the spin dryer.

SUMMARY OF THE INVENTION

The present invention is generally directed to a dryer lid/robot collision prevention system which prevents inadvertent collision of a spin dryer lid with a transfer robot as the robot approaches and loads wafer-containing cassettes into the spin dryer. The system includes at least one, and typically, a pair of photoelectric sensors mounted on an inner wall behind the spin dryer lid. Each of the photoelectric sensors is electrically connected to a relay circuit which activates a cylinder sensor in the spin dryer in the event that the photoelectric sensors sense the normal position of the open spin dryer lid. The cylinder sensors activate a PLC module, which activates the cassette cradles in the spin dryer. Finally, the activated mode of the cassette cradles signals the transfer robot to approach and load the wafer cassettes into the cassette cradles. The system may include a bypass switch for bypassing the system, as desired.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
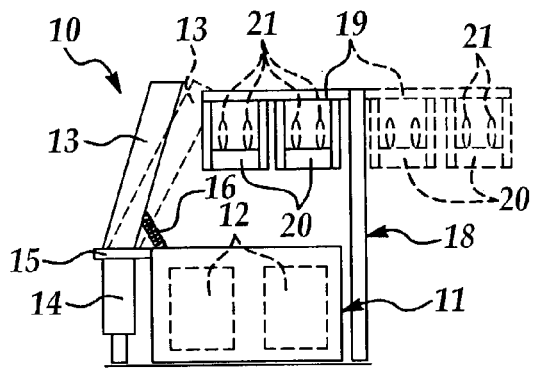
FIG. 1 is a side view of a typical conventional wet bench spin dryer for semiconductor wafers, illustrating typical robot-actuated loading of wafer cassettes into the spin dryer.
Figure 2:
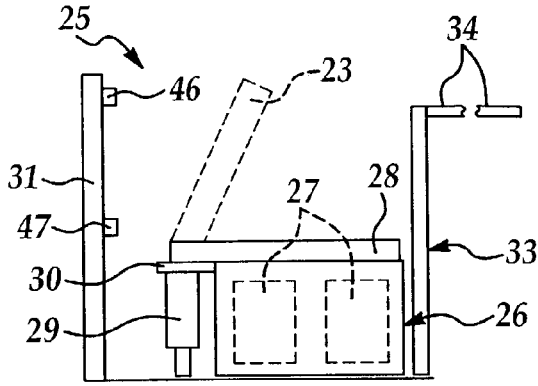
FIG. 2 is a side view of a wet bench spin dryer in implementation of the present invention.

Referring initially to FIG. 2, a wet bench spin dryer 25 suitable for implementation of the present invention is shown. The wet bench spin dryer 25 may be a conventional KAIJO (trademark) spin dryer which is commonly used to dry semiconductor wafers (not shown) using centrifugal motion after the wafers are rinsed in a DI water bath. The spin dryer 25 includes a chamber 26 which contains a pair of cassette cradles 27, each of which receives a wafer cassette (not shown), containing multiple wafers (not shown), from a robot arm 34 of a wafer transfer robot 33, as hereinafter described. A hinge 30 pivotally mounts a typically stainless steel lid 28 on the chamber 31. The lid 28 is raised and lowered at the hinge 30 by actuation of a lid cylinder 29. A plastic stabilization chain 82 stabilizes the lid 28 in a level plane as the lid 28 is opened. An inner wall 31 of the spin dryer system typically extends vertically behind the spin dryer 25.

Figure 3:
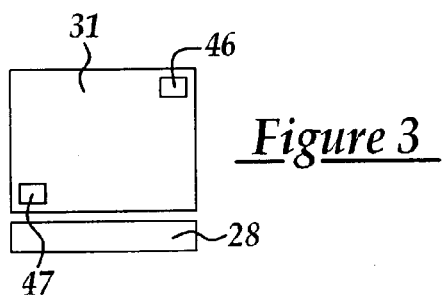
FIG. 3 is a front view of an inner wall of a spin dryer system, with diagonally-spaced high end and low end photoelectric sensors mounted on the wall in implementation of the present invention.
Figure 4:
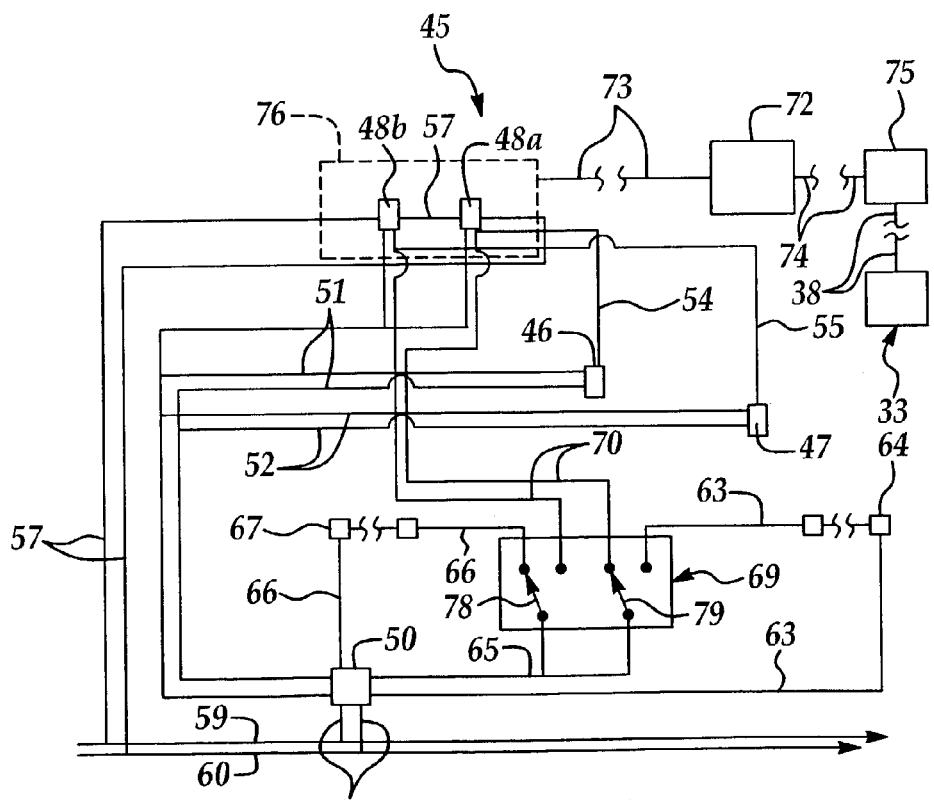
FIG. 4 is an electrical schematic diagram of an illustrative embodiment of the system of the present invention.
Figure 5:
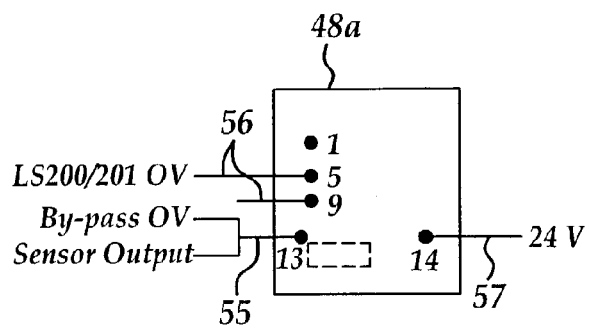
FIG. 5 is an electrical schematic diagram of a relay circuit of the present invention.

Referring next to FIGS. 2–4, the collision prevention system 45 of the present invention, an electrical schematic diagram of which is shown in FIG. 4, includes a high end photoelectric sensor 46 and a low end photoelectric sensor 47 which are mounted on the inner wall 31, typically in diagonally-spaced relationship to each other, above the closed lid 28 of the spin dryer 25. As hereinafter described, the high end photoelectric sensor 46 senses shifted positioning of the lid 28 caused by formation of fractures in the welding joints of the lid 28, whereas the low end photoelectric sensor 47 senses deformation of the plastic stabilization chain 82 that functions to stabilize the lid 28 in an even plane during opening. The high end photoelectric sensor 46 and the low end photoelectric sensor 47 may each be an OMRON (trademark) model E3S-LS20C4S. As shown in FIG. 2, when fully opened, the lid 28 extends at least as high as the high end photoelectric sensor 46. As shown in FIG. 4, the high end photoelectric sensor 46 is electrically connected to a relay circuit 48a [OMRON (trademark) model MY2N-D2 DC 24V] through high end signal wiring 54. In like manner, the low end photoelectric sensor 47 is electrically connected to a relay circuit 48b [OMRON (trademark) model MY2N-D2 DC 24V] through low end signal wiring 55. The relay circuit 48a and relay circuit 48b are each electrically connected to a cylinder sensor 76 (LS200, LS201) through cylinder sensor wiring 56 (FIG. 5). The cylinder sensor 76 is, in turn, electrically connected to a PLC module (ID219) 72 through module wiring 73, and the PLC module 72 is electrically connected to an equipment computer (EC) 75 for operating the spin dryer 25, through EC wiring 74. Finally, the equipment computer 75 is electrically connected to the wafer transfer robot 33 through robot wiring 38.

As further shown in FIG. 4, 24 volt wiring 59 and 0 volt wiring 60 are connected to a terminal box 50 through terminal box input wiring 61. The terminal box 50 is connected to the high end photoelectric sensor 46 through high end sensor wiring 51 and to the low end photoelectric sensor 47 through low end sensor wiring 52. High end index lamp wiring 63 connects the terminal box 50 to a bypass switch 69, through a typically 12-volt, DC high end index lamp 64. Low end index lamp wiring 66 connects the terminal box 50 to the bypass switch 69 through a typically 12-volt, DC low end index lamp 67. Switch wiring 65 connects the terminal box 50 to the bypass switch 69. Accordingly, the terminal box 50, the high end index lamp wiring 63, the high end index lamp 64, the bypass switch 69 and the switch wiring 65 define a circuit for the high end index lamp 64, whereas the terminal box 50, the low end index lamp wiring 66, the low end index lamp 67, the bypass switch 69 and the switch wiring 65 define a circuit for the low end index lamp 67. Bypass wiring 70 connects the bypass switch 69 to the relay circuits 48a and 48b, respectively. Relay wiring 57 connects the 24 volt wiring 59 and the 0 volt wiring 60 to the relay circuit 48a and the relay circuit 48*b*. An electrical schematic diagram for the bypass switch 69 is further shown in FIG. 6. While the relay circuit schematic is indicated by reference numeral 48*a* in FIG. 5, the structure and function of both the relay circuit 48*a* and the relay circuit 48*b* will hereinafter be described with respect to FIG. 5.

Figure 6:
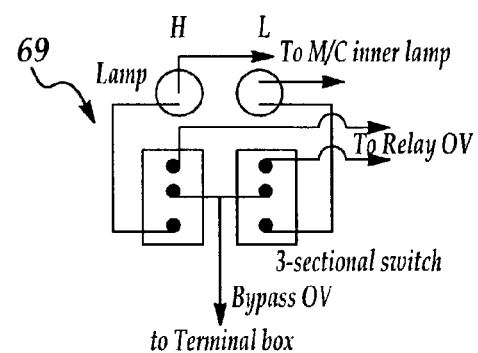
FIG. 6 is an electrical schematic diagram of a bypass switch of the present invention.
Figure 7:
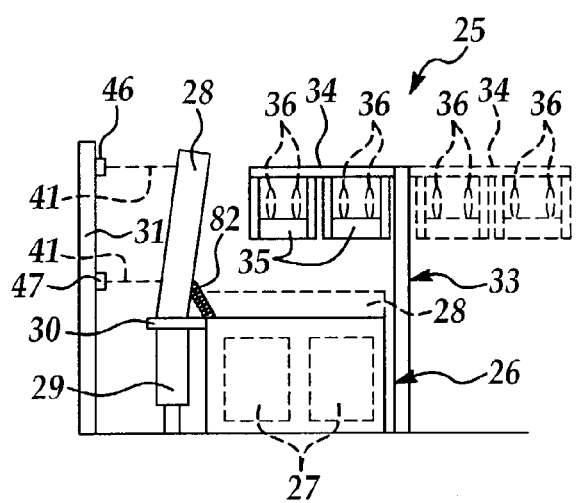
FIG. 7 is a side view of a wet bench spin dryer for semiconductor wafers, illustrating a normal open position for the spin dryer lid and robot-actuated loading of wafer cassettes into the spin dryer in implementation of the present invention.

Referring next to FIGS. 4–8, in use of the collision prevention system 45, the lid 28 of the wet bench spin dryer 25 is initially raised to facilitate placement of a pair of wafer cassettes 35, each containing multiple wet semiconductor wafers 36, in the respective cassette cradles 27 in the chamber 26 of the spin dryer 25. Accordingly, as shown in FIG. 7, under normal circumstances, the lid 28 is raised, typically by automated actuation of the lid cylinder 29, from the closed position indicated by the dotted lines to the fully-open position indicated by the solid lines, to facilitate placement of the wafer cassettes 35 into the cassette cradles 27 by automated actuation of the wafer transfer robot 33. As the lid 28 is raised to the fully-open position, the high end photoelectric sensor 46 and the low end photoelectric sensor 47 each senses a change in intensity of the light 41 entering the respective sensors 46, 47, due to the raised lid 28. Accordingly, each of the sensors 46, 47 transmits a voltage signal of 0 volts to the corresponding relay circuit 48*a* and 48*b*. As shown in FIG. 5, the output voltage signal of 0 volts from the sensors 46, 47 are transmitted to point 13 on each of the respective relay circuits 48*a* and 48*b*. This causes the incoming 24-volt signal at point 14 from the relay wiring 57 to close the circuit between points 5 and 9 on each relay circuit 48*a* and 48*b*, at which point the relay circuits 48*a*, 48*b* energize the cylinder sensor 76 through the cylinder sensor wiring 56. An LED (not shown) may be included in each relay circuit 48*a* and 48*b*, in which case the LED is illuminated upon closing of the circuit. The energized cylinder sensor 76 actuates the PLC module 72 which, in turn, signals the equipment computer 75 to energize the cassette cradles 27 in the spin dryer 25. The equipment computer 75 may be programmed to energize the cassette cradles 27 after a predetermined period of time, such as 90 seconds, for example. Finally, the equipment computer 75 actuates the wafer transfer robot 33 to initiate and sustain the cassette-loading process, at which time the robot arm 34, carrying the wafer cassettes 35, approaches the now-open chamber 26 of the spin dryer 25, as indicated by the solid lines in FIG. 7, and lowers the wafer cassettes 35 into the respective cassette cradles 27. Finally, the lid 28 is closed and the wafers 36 are dried in the spin dryer 25 according to process parameters known by those skilled in the art. After the drying process is completed, the lid 28 is again opened and the robot 33 removes the wafer cassettes 35 from the chamber 26 of the spin dryer 25 for further processing of the wafers 36 at a separate processing station.

Figure 8:
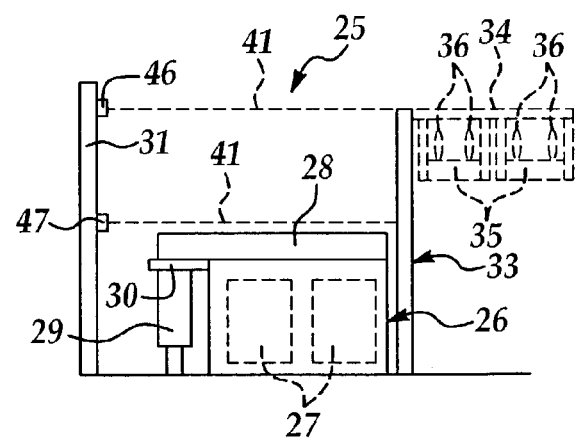
FIG. 8 is a side view of a wet bench spin dryer, illustrating termination of the wafer cassette-loading operation due to failure of the spin dryer lid in implementation of the present invention.
Figure 9:
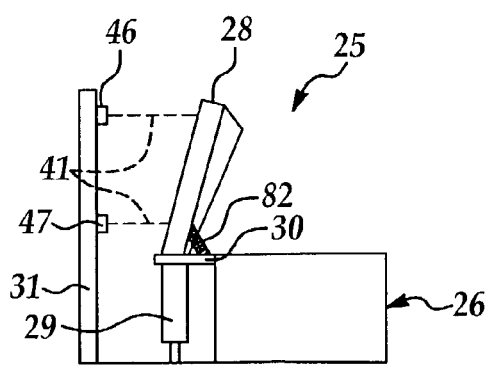
FIG. 9 is a side view of a wet bench spin dryer, illustrating termination of the wafer cassette-loading operation due to inadvertent tilting of the spin dryer lid in implementation of the present invention.

As shown in FIG. 8, in the event that the lid 28 fails to open or opens and then falls back to the closed position on the chamber 26, or the position of the lid 28 becomes shifted as may occur in the event of partial or complete failure of the welding joints of the hinge 30, the high end sensor 46 senses the closed or shifted position of the lid 28 due to the difference in light which is received by the sensor 46 when the lid opens normally. Furthermore, in the event that the plastic chain 82 becomes distorted in such a manner that the lid 28 is in danger of opening in an uneven plane, as shown in FIG. 9, the low end sensor 47 senses the deformation of the chain 82. Accordingly, in either case a 24-volt output signal is transmitted from either or both of the sensors 46, 47 to the respective relay circuits 48*a*, 48*b*. Consequently, the relay circuits 48*a*, 48*b* maintain an open circuit between points 5 and 9 shown in FIG. 5, such that the cylinder sensor 76 is not actuated. Consequently, the PLC module 72 fails to signal the equipment computer 75 to energize the cassette cradles 27 in the spin dryer 25, and thus, to actuate the wafer transfer robot 33 to initiate and complete the wafer cassette-loading process. Because the robot arm 19 of the robot 18 remains idle at the final rinse bath (not shown) from which the wafers 21 are removed and does not approach the chamber 26 of the spin dryer 25, potential collisions which may otherwise occur between the robot 33 and the lid 28 in the event that the cassette-loading procedure is initiated and continued, are prevented. The equipment computer 75 may signal the closed or inadequately opened position of the lid 28 audibly, such as by use of a buzzer, and may further indicate the closed status of the lid 28 by displaying an appropriate visual indication.

As shown in FIGS. 4 and 6, the bypass switch 69 includes a low end lamp switch 78 and a high end lamp switch 79. The low end lamp switch 78 normally completes the circuit between the terminal box 50, the low end index lamp 67 and the bypass switch 69 to illuminate the low end index lamp 67. Similarly, the high end lamp switch 79 normally completes the circuit between the terminal box 50, the high end index lamp 64 and the bypass switch 69 to illuminate the high end index lamp 64. In this switch configuration, both the high end photoelectric sensor 46 and the low end photoelectric sensor 47 remain functional and the collision prevention system 45 is enabled. By switching the low end lamp switch 78 to establish electrical communication between the switch wiring 65 and the bypass wiring 70, the low end photoelectric sensor 47 is bypassed and the low end index lamp 67 is extinguished. Similarly, by switching the high end lamp switch 79 to establish electrical communication between the switch wiring 65 and the bypass wiring 70, the high end photoelectric sensor 46 is bypassed and the high end index lamp 64 is extinguished. When both the low end lamp switch 78 and the high end lamp switch 79 are positioned to establish electrical communication between the switch wiring 65 and the bypass wiring 70, both the low end photoelectric sensor 47 and the high end photoelectric sensor 46 are bypassed and the collision prevention system 45 is disabled.

Referring next to FIG. 9, in the event that the lid 28 of the spin dryer 25 begins to tilt or inadvertently close during the wafer cassette-loading operation, the collision prevention system 45 is capable of terminating approach of the robot 33 toward the spin dryer 25 and loading of the wafer cassettes 20 into the cassette cradles 12. For example, in the event that the lid 28 tilts 2–5 mm out of a normal plane for the lid 28, the high end photoelectric sensor 46, the low end photoelectric sensor 47, or both sensors 46, 47 sense the abnormal position of the lid 28 and transmit a 24-volt output signal to the relay circuit 48*a* and/or 48*b*. Accordingly, the relay circuit 48*a* and/or 48*b* reverts from the closed to the open configuration, thereby turning off the cylinder sensor 76. This transmits a signal to the PLC module 72, which signals the equipment computer 75 to turn off the cassette cradles 27 and terminate further cassette-loading operation of the wafer transfer robot 33.

While the preferred embodiments of the invention have been described above, it will be recognized and understood that various modifications can be made in the invention and the appended claims are intended to cover all such modifications which may fall within the spirit and scope of the invention.

What is claimed is:

1. A system for preventing collision of a wafer transfer robot with a lid of a spin dryer by sensing fatigue of a hinge connecting the lid to the spin dryer, comprising:
   a sensor for sensing normal and shifted positions of the lid; and
   a relay circuit electrically connected to said sensor for operable connection to the wafer transfer robot and activating the wafer transfer robot when the lid is in said normal condition and preventing activation of the wafer transfer robot when the lid is in said shifted position.

2. The system of claim 1 further comprising a second sensor for sensing normal and distorted positions of a stabilizing chain provided on the spin dryer and a second relay circuit electrically connected to said second sensor for operable connection to the wafer transfer robot and preventing activation of the wafer transfer robot when the stabilizing chain is in said distorted position.

3. The system of claim 1 further comprising a bypass switch electrically connected to said relay circuit for selectively bypassing said sensor.

4. The system of claim 3 further comprising a second sensor for sensing normal and distorted positions of a stabilizing chain provided on the spin dryer and a second relay circuit electrically connected to said second sensor for operable connection to the wafer transfer robot and preventing activation of the wafer transfer robot when the stabilizing chain is in said distorted position and a second relay circuit electrically connected to said second sensor for selectively bypassing said second sensor.

5. The system of claim 1 further comprising a PLC module operably connected to said relay circuit and an equipment computer operably connected to said PLC module, and wherein said equipment computer is adapted for operable connection to the wafer transfer robot for actuating the wafer transfer robot when the lid is in said normal position.

6. The system of claim 5 further comprising a second sensor for sensing normal and distorted positions of a stabilizing chain provided on the spin dryer and a second relay circuit electrically connected to said second sensor for operable connection to the wafer transfer robot and preventing activation of the wafer transfer robot when the stabilizing chain is in said distorted position, and wherein said PLC module is operably connected to said second relay circuit.

7. The system of claim 5 further comprising a bypass switch electrically connected to said relay circuit for selectively bypassing said sensor.

8. The system of claim 7 further comprising a second sensor for sensing normal and distorted positions of a stabilizing chain provided on the spin dryer and a second relay circuit electrically connected to said second sensor for operable connection to the wafer transfer robot and preventing activation of the wafer transfer robot when the stabilizing chain is in said distorted position, and wherein said PLC module is operably connected to said second relay circuit.

9. The system of claim 1 wherein said sensor comprises a photoelectric sensor.

10. The system of claim 9 further comprising a second photoelectric sensor for sensing normal and distorted positions of a stabilizing chain provided on the spin dryer and a second relay circuit electrically connected to said second sensor for preventing activation of the wafer transfer robot when the stabilizing chain is in said distorted position.

11. The system of claim 9 further comprising a bypass switch electrically connected to said relay circuit for bypassing said sensor.

12. The system of claim 9 further comprising a PLC module operably connected to said relay circuit and an equipment computer operably connected to said PLC module, and wherein said equipment computer is adapted for operable connection to the wafer transfer robot and actuating the wafer transfer robot when the lid is in said normal position.

13. A system for preventing collision of a wafer transfer robot with a lid of a spin dryer having an inner wall and a chain for stabilizing the lid, said system comprising:
   a high end sensor for mounting on the inner wall and sensing normal and shifted positions of the lid;
   a low end sensor for mounting on the inner wall beneath said high end sensor and sensing normal and distorted positions of the chain;
   a first relay circuit and a second relay circuit electrically connected to said high end sensor and said low end sensor, respectively, for operable connection to the wafer transfer robot and activating the wafer transfer robot when the lid and the chain are in said normal position and preventing actuation of the wafer transfer robot when at least one of said high end sensor and said low end sensor senses at least one of said shifted position of the lid and said distorted position of the chain.

14. The system of claim 13 further comprising a bypass switch electrically connected to said first relay circuit and said second relay circuit for selectively bypassing said high end sensor and said low end sensor.

15. The system of claim 13 further comprising a PLC module operably connected to said first relay circuit and said second relay circuit and an equipment computer operably connected to said PLC module, and wherein said equipment computer is adapted for operable connection to the wafer transfer robot for actuating the wafer transfer robot when the lid and the chain are in said normal position.

16. The system of claim 15 further comprising a bypass switch electrically connected to said first relay circuit and said second relay circuit for bypassing said high end sensor and said low end sensor.

17. A method of preventing collision of a wafer transfer robot with a lid of a spin dryer by sensing metal fatigue of a hinge mounting the lid on the spin dryer, said method comprising the steps of:
   providing a high end sensor adjacent to the spin dryer for sensing normal and shifted positions of the lid;
   electrically connecting a relay circuit to said high end sensor and to the wafer transfer robot;
   activating the wafer transfer robot when said lid is in said normal position by transmitting an activation signal from said high end sensor to the wafer transfer robot; and
   preventing activation of the wafer transfer robot when said lid is in said shifted position by preventing transmission of said activation signal from said high end sensor to the wafer transfer robot.

18. The method of claim 17 further comprising the steps of providing a low end sensor adjacent to the spin dryer beneath and in substantially diagonal relationship to said high end sensor for sensing normal and distorted positions of a chain for stabilizing the lid of the spin dryer; electrically connecting a second relay circuit to said low end sensor and to the wafer transfer robot; activating the wafer transfer robot when said lid and said chain are in said normal position by transmitting said activation signal from said high end sensor to the wafer transfer robot and a second activation signal from said low end sensor to the wafer transfer robot; and preventing activation of the wafer transfer robot when at least one of the lid is in said shifted position and the chain is in said distorted position by preventing transmission of at least one of said activation signal and said second activation signal from at least one of said high end sensor and said low end sensor to the wafer transfer robot.

19. The method of claim 18 further comprising the step of electrically connecting a bypass switch to said first relay circuit and said second relay circuit for selectively bypassing said high end sensor and said low end sensor.

20. The method of claim 18 further comprising the steps of operably connecting a PLC module to said first relay circuit and said second relay circuit and operably connecting an equipment computer to said PLC module, and operably connecting said equipment computer to the wafer transfer robot for actuating the wafer transfer robot when the lid and the chain are in said normal position.

* * * * *